(12) United States Patent
Dede et al.

(10) Patent No.: US 9,780,279 B2
(45) Date of Patent: Oct. 3, 2017

(54) THERMO-ELECTROCHEMICAL CELL ENERGY RECOVERY SYSTEM

(71) Applicant: Toyota Motor Engineering & Manufacturing North America, Inc., Erlanger, KY (US)

(72) Inventors: Ercan Mehmet Dede, Ann Arbor, MI (US); Feng Zhou, Ann Arbor, MI (US); Shailesh Joshi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 126 days.

(21) Appl. No.: 14/681,170

(22) Filed: Apr. 8, 2015

(65) Prior Publication Data

US 2016/0300995 A1 Oct. 13, 2016

(51) Int. Cl.
*H01L 35/30* (2006.01)
*H01L 35/22* (2006.01)
(Continued)

(52) U.S. Cl.
CPC .............. *H01L 35/30* (2013.01); *B60K 11/00* (2013.01); *B60R 16/00* (2013.01); *B60R 16/033* (2013.01);
(Continued)

(58) Field of Classification Search
CPC ........ H01M 6/30; H01M 6/36; H01M 10/625; H01M 10/66; H01M 2200/20;
(Continued)

(56) References Cited

U.S. PATENT DOCUMENTS 6,204,769 B1 * 3/2001 Arai ..................... B60L 3/0046
180/65.1
6,373,206 B1 * 4/2002 Morimoto ........... F16F 15/1407
123/192.1
(Continued)

FOREIGN PATENT DOCUMENTS

JP   2002352867 A  * 12/2002
JP   2013107420 A  *  6/2013

OTHER PUBLICATIONS

Im et al.; "Flexible thermocell and utilization of body heat"; Nano Research, Jan. 10, 2014; in 15 pages.
(Continued)

*Primary Examiner* — Gregg Cantelmo
(74) *Attorney, Agent, or Firm* — Christopher G. Darrow; Darrow Mustafa PC

(57) ABSTRACT

Systems and methods are provided for generating electric power using low grade thermal energy from a vehicle. The methods may include surrounding at least a portion of a coolant conduit system with a flexible thermo-electrochemical cell including a nanoporous cathode electrode, a nanoporous anode electrode, and an electrolyte. A coolant fluid may be circulated through the coolant conduit system, which is in thermal communication with a power generating unit, such as an internal combustion engine or fuel cell stack. The method includes maintaining a temperature gradient in the electrolyte solution by contacting the anode electrode with the coolant conduit system, and exposing the cathode electrode to a temperature lower than a temperature of the coolant conduit system. Generated electrical charges can be collected for subsequent use.

14 Claims, 3 Drawing Sheets

(51) Int. Cl.

| | |
|---|---|
| *B60R 16/04* | (2006.01) |
| *B60R 16/033* | (2006.01) |
| *B60R 16/00* | (2006.01) |
| *B60K 11/00* | (2006.01) |
| *B60K 11/02* | (2006.01) |
| *H01M 2/02* | (2006.01) |
| *H01M 6/30* | (2006.01) |
| *H01M 6/36* | (2006.01) |
| *H01M 10/625* | (2014.01) |
| *H01M 10/66* | (2014.01) |

(52) U.S. Cl.
CPC .............. *B60R 16/04* (2013.01); *H01L 35/22* (2013.01); *H01M 6/30* (2013.01); *H01M 6/36* (2013.01); *H01M 10/625* (2015.04); *H01M 10/66* (2015.04); *B60K 11/02* (2013.01); *H01M 2002/0205* (2013.01); *H01M 2200/20* (2013.01)

(58) Field of Classification Search
CPC ........... H01M 2002/0205; H01L 35/30; H01L 35/22; B60R 16/04; B60R 16/033; B60R 16/00; B60K 11/00; B60K 11/02
See application file for complete search history.

(56) References Cited

U.S. PATENT DOCUMENTS

| | | | |
|---|---|---|---|
| 7,105,249 B2* | 9/2006 | Hall | H01M 2/025 429/127 |
| 2005/0139250 A1* | 6/2005 | DeSteese | H01L 35/16 136/212 |
| 2007/0227472 A1* | 10/2007 | Takeuchi | F01P 3/20 123/41.19 |
| 2010/0186422 A1 | 7/2010 | Yang et al. | |
| 2011/0120114 A1* | 5/2011 | Alexander | F02G 5/04 60/527 |
| 2012/0073276 A1 | 3/2012 | Meisner et al. | |
| 2014/0090150 A1 | 4/2014 | Skertic | |
| 2014/0096685 A1 | 4/2014 | Backhaus-Ricoult et al. | |
| 2014/0224291 A1 | 8/2014 | Bell et al. | |
| 2014/0305481 A1 | 10/2014 | Brandenburg et al. | |

OTHER PUBLICATIONS

Hu et al.; "Harvesting Waste Thermal Energy Using a Carbon-Nanotube-Based Thermo-Electrochemical Cell"; Nano Letters (ACS), 10 (3); Feb. 19, 2010; pp. 838-846; in 9 pages.

* cited by examiner

THERMO-ELECTROCHEMICAL CELL ENERGY RECOVERY SYSTEM

TECHNICAL FIELD

The present disclosure generally relates to energy management and, more particularly, to systems and methods for recapturing energy and improving the means for generating electricity from low-grade heat.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Renewable energy sources are becoming increasingly important. Various benefits can be obtained when waste heat is captured and converted into a form of usable energy. Secondary waste heat or low-grade heat (generally less than 150° C.) is abundant and often available as discharged heat from vehicles, HVAC systems, manufacturing/industrial facilities, power plants, and even from geothermal applications. Often, however, conventional thermal energy collecting and storage systems may not work well when used with low-grade heat, and this abundant resource is not able to be utilized to its potential. Thermo-electrochemical cells have been proposed for converting thermal energy into electrical energy by having temperature gradients across electrodes of the cell. However, the energy conversion efficiency of such devices has generally been limited by the speed of ion transport as dictated by current designs, availability of materials, costs, and thermodynamic principles.

Accordingly, it would be desirable to provide a further optimized conversion of waste or low-grade thermal energy into electricity that, for example, is capable of providing enhanced vehicle ranges, higher efficiencies, and driving distance per unit energy. With respect to hybrid electric and fuel cell powered vehicles, for example, it would be desirable to have a thermo-electrochemical cell system to provide additional electrical power that may be required during increasingly longer drive periods commensurate with improved vehicle ranges.

SUMMARY

This section provides a general summary of the disclosure, and is not a comprehensive disclosure of its full scope or all of its features.

In various aspects, the present teachings provide an energy recovery system for generating electric power using low-grade thermal energy from a vehicle. The system may include a coolant conduit system and a coolant pump configured to circulate a coolant fluid through the coolant conduit system, which is in thermal communication with a power generating unit. A flexible thermo-electrochemical cell may be shaped and conformed to surround at least a portion of the coolant conduit system. The flexible thermo-electrochemical cell includes a nanoporous cathode electrode, a nanoporous anode electrode, and an electrolyte. At least one of the anode electrode and the cathode electrode may comprise an activated carbon textile coated with carbon multiwalled nanotubes. The anode electrode is provided in thermal contact with the coolant conduit system, and the cathode electrode is exposed to a temperature lower than a temperature of the coolant conduit system.

In other aspects, the present teachings provide a method for generating electric power using low grade thermal energy from a vehicle. The method may include surrounding at least a portion of a coolant conduit system with a flexible thermo-electrochemical cell including a nanoporous cathode electrode, a nanoporous anode electrode, and an electrolyte. A coolant fluid may be circulated through the coolant conduit system, which is in thermal communication with a power generating unit, such as an internal combustion engine or fuel cell stack. The method includes maintaining a temperature gradient in the electrolyte solution by contacting the anode electrode with the coolant conduit system, and exposing the cathode electrode to a temperature lower than a temperature of the coolant conduit system. Generated electrical charges can be collected for subsequent use.

In still other aspects, the present teachings provide a method for converting thermal heat into electricity to self-power an auxiliary device. The method includes contacting at least a portion of a conduit with a flexible thermo-electrochemical cell including a cathode electrode, a anode electrode, and an electrolyte. A fluid is maintained circulating through the conduit in thermal communication with a heat source. The method includes maintaining a temperature gradient in the electrolyte by keeping the anode electrode in contact with the conduit system, and exposing the cathode electrode to a temperature lower than a temperature of the conduit system. The generated electricity may be collected directed to the auxiliary device.

Further areas of applicability and various methods of enhancing energy recovery technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figure 1:
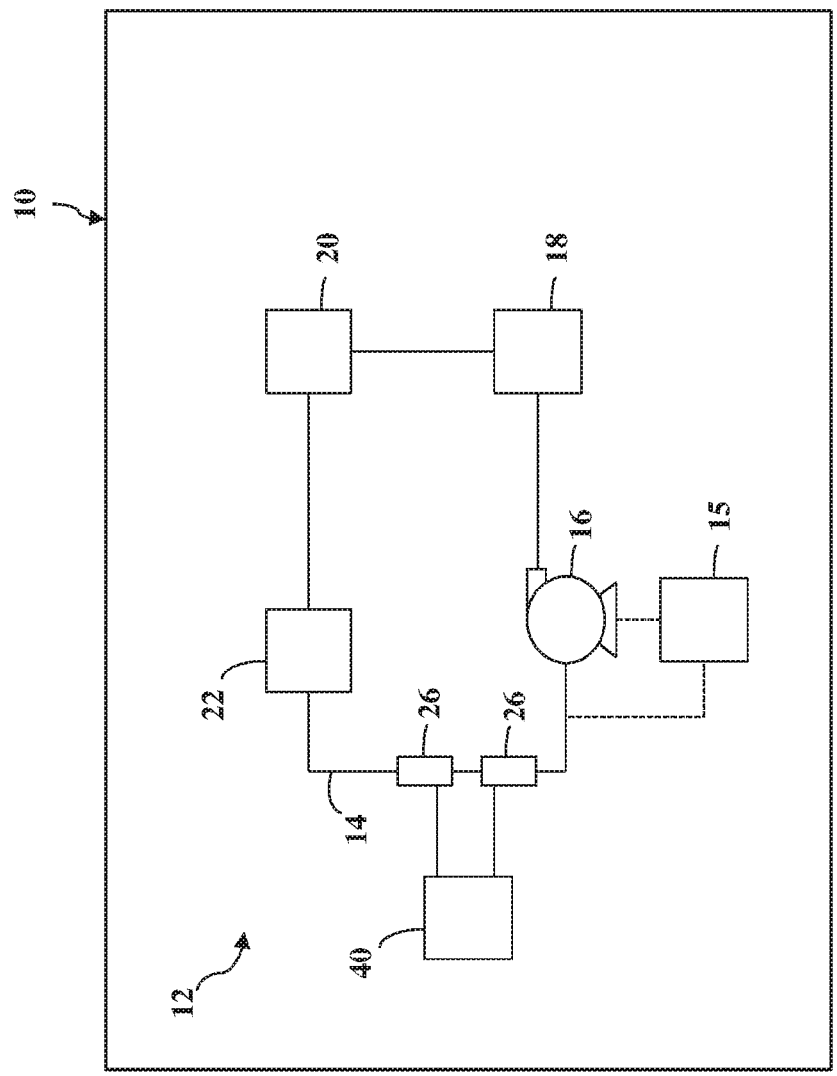
FIG. 1 is an exemplary, simplified diagram illustrating a vehicle configured with an energy recovery system for generating electric power using low-grade heat in an accordance with various aspects of the present technology.

It should be noted that the figures set forth herein are intended to exemplify the general characteristics of materials, methods, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The following description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

The present technology generally relates to systems and methods for recapturing energy and generating electrical power from thermal energy. Waste heat recovery using thermo-electrochemical cells has generally been limited by their low power and conversion efficiencies. Thermo-electrochemical cells rely on an applied temperature difference between two spaced apart electrodes in order to transfer ions through an electrolyte medium. Thermo-electrochemical cells are thus electrochemical devices that produce a steady electric current under the applied temperature difference. In contrast to solid-state thermoelectrics, thermo-electrochemical cells can have substantially greater thermal-to-voltage conversion and potentially lower cost. Energy conversion efficiencies, however, may be limited by the relatively slower transport of ions as compared to the faster transport of electrons performed in other thermoelectrics. Thermo-electrochemical cells generally include a redox electrolyte that generates an open circuit voltage $V_{oc}$ as follows:

$$V_{oc} = \frac{\Delta S_{rx}(T_h - T_c)}{nF}$$

where $\Delta S_{rx}$ is the standard redox reaction entropy of the electrolyte, F is the Faraday constant, n is the number of electrons transferred in the redox reaction, $T_h$ is the hot temperature at the anode, and $T_c$ is the cold temperature at the cathode.

In one particular aspect, the present technology contemplates the use of a thin and flexible thermo-electrochemical cell wrap that can be configured, shaped, and conformed about a portion of a coolant conduit system of a vehicle. By recapturing energy in the form of electricity, the systems and methods of the present technology can help to improve the efficiencies of vehicles, for example in driving distance per unit energy. In various aspects, it is envisioned that use of the present technology may reduce and/or eliminate a need for plug-in charging for battery usage for vehicles. In other aspects, it is contemplated that the present technology can also be used in residential housing applications and with certain geothermal energy recovery systems. For example, thermal energy may be captured from residential hot and cold water pipe systems and converted into electrical energy to power auxiliary devices, as will be described in more detail below.

As used herein, the term "vehicle" should be construed having a broad meaning, and should include all types of vehicles, with non-limiting examples including a passenger car, truck, motorcycle, off-road vehicle, bus, boat, airplane, helicopter, lawn mower, recreational vehicle, amusement park vehicle, farm vehicle, construction vehicle, tram, golf cart, train, or trolley, etc.

In various non-limiting aspects, the present technology may be applicable to hybrid electric vehicles typically having a hydrocarbon/fossil-fuel (or equivalent) based internal combustion engine as a power generating unit. In other aspects, the present technology may be applicable to fuel cell powered vehicles, for example, vehicles having at least one fuel cell or fuel cell stack as a power generating unit to drive a motor. Internal combustion engines and fuel cell stacks may generate heated exhausts and require cooling that may be accomplished by using various coolant fluids circulated by a coolant conduit system.

As used herein, low-grade heat is generally referred to waste heat having a temperature of less than about 150° C. Typical vehicle power generating units 20 may have an operating temperature of from about 85° C. to about 110° C. for an internal combustion engine, and slightly lower, or from about 60° C. to about 100° C. for a fuel cell or hybrid-electric powered vehicle.

FIG. 1 illustrates an exemplary, simplified diagram of a vehicle 10 configured with an energy recovery system 12 for generating electric power using low-grade heat in an accordance with various aspects of the present technology. As depicted, the vehicle 10 may include a coolant conduit system 14 that is configured with a coolant pump 16 to circulate a coolant fluid in a continuous loop manner in order to remove heat from a power generating unit 20. As described above, the type of power generating unit 20 may vary based on the type of vehicle. Several other components, such as a radiator 18, a power control unit 22, and a motor (not shown) may also be in both fluid communication and thermal communication with the coolant fluid. It should be understood that the coolant conduit system 14 of the present technology may be designed with many different variations and configurations, as desired. FIG. 1 is generally shown to indicate the basic relationship between the coolant conduit system 14 and other vehicle components. In various aspects, the coolant conduit system 14 may be separated into different regions, optionally operating at slightly different temperatures. In this regard, a plurality of thermo-electrochemical cells may be provided and arranged, for example, in a serial array.

In various aspects, at least one controller 15 may be provided to control various devices, systems, and methods according to the present teachings. The controller 15 may include software and appropriate algorithms that may cooperate with one or more thermostats, other controllers, or computer systems of the vehicle, which are not specifically shown herein for purposes of simplicity. Thus, it should be understood that the controller 15 may be in direct or indirect communication with various components of the system, even if it is not specifically shown. Certain methods may use computer program products accessible from a computer-usable or computer-readable medium providing program or software code that can be used with a computer, computing device, server, remote server, or any other type of execution system. For purposes of this description, and as known to those of ordinary skill in the art, a computer-usable or computer-readable medium can include any device or apparatus that can contain, store, communicate, propagate, or transport the program for use by or in connection with an instruction execution system, apparatus, or device.

In one example, the controller 15 may be configured to monitor, operate, and separately direct a flow of coolant fluid via the coolant pump 16, optionally using various valves (not shown), through the coolant conduit system 14. Depending on the desired temperature for use with the thermo-electrochemical cells, it may be necessary to pass the coolant fluid through one or more heat exchangers in order to lower a temperature of the coolant fluid, as may be desired. The controller 15 may also be in electrical communication with current collecting electrodes located at various locations of the thermo-electrochemical cells in order to collect, store, and distribute electrical power, for example, to a coolant pump. Additional non-limiting examples of auxiliary devices that may use the electrical power can include various flow meters, temperature sensors, or other wireless telemetry devices. The electrical power may be stored in one or more capacitors or vehicle batteries.

Figure 3:
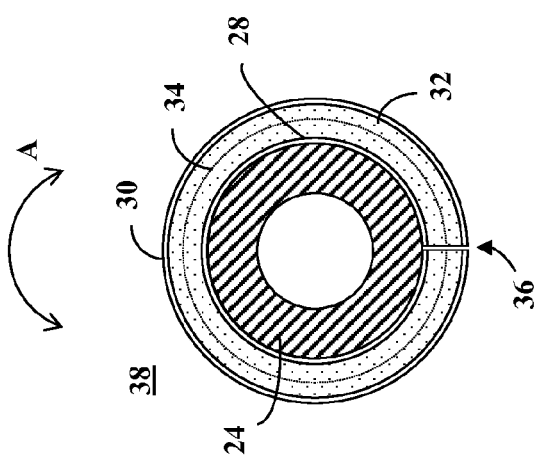
FIG. 3 is a cross-sectional view of the coolant conduit system taken along the line 3-3 of FIG. 2.
Figure 2:
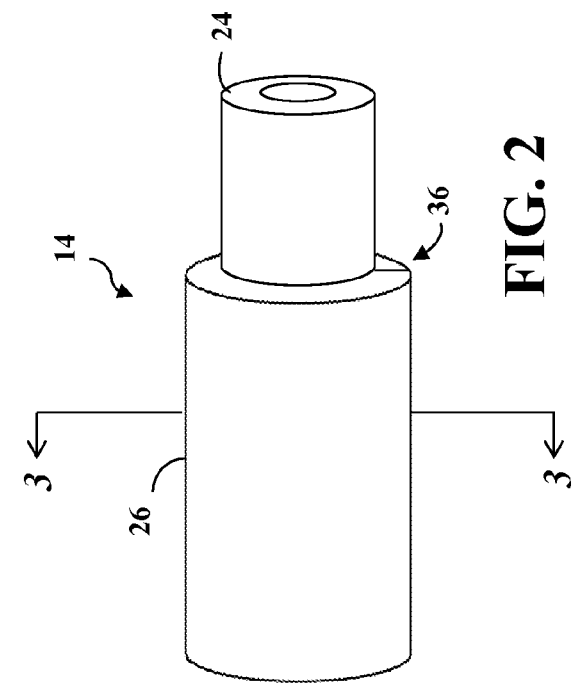
FIG. 2 is a side perspective view of a portion of a coolant conduit system with a partial cut-out illustrating a conduit having a flexible thermo-electrochemical cell wrapped around a perimeter according to various aspects of the present technology.

FIG. 2 is a side perspective view of a portion of the coolant conduit system 14 with a partial cut-out illustrating a conduit 24 having a flexible thermo-electrochemical cell 26 wrapped around a perimeter according to various aspects of the present technology. Although shown as cylindrical in shape, the conduit 24 may be provided having various other designs. Generally, the flexible thermo-electrochemical cell 26 is in thermal contact with a perimeter of at least a portion of the conduit 24. FIG. 3 is a cross-sectional view taken along the line 3-3 of FIG. 2 in order to better illustrate the layered features and elements of the design. Similar to FIG. 1, it should be understood that the various features as shown in FIGS. 2 and 3 are non-limiting examples, are not drawn to scale, and do not necessarily include every component of the present technology.

With reference to FIG. 3, the flexible thermo-electrochemical cell may include an anode electrode 28 and a cathode electrode 30 separated by an electrolyte 32 with a suitable thin membrane or separator 34. In various aspects, the flexible thermo-electrochemical cell is wholly or partially contained within a polyester (PET) or MYLAR® type film. As shown, the anode electrode 28 may be in thermal contact with the conduit 24 and the cathode electrode may be in thermal contact with an ambient air environment 38. In this manner, the cathode electrode is then exposed to a temperature lower than a temperature of the conduit 24 and the coolant conduit system 14. A plurality of spaced apart current collecting electrodes may be provided at various locations within the cell 26 and electrically coupled to one or more capacitors 40 for storing electrical power generated from the cell. In various aspects, the difference in temperature between the anode electrode 28 and the cathode electrode 30 may be from about 10° C. to about 70° C. such that an average temperature gradient in the electrolyte 32 disposed between the anode electrode 28 and the cathode electrode 30 is maintained from about 20° C. to about 60° C. Although the above example depicts the conduit at a high temperature and the surrounding environment at a lower temperature relative to the conduit, it should be understood that the present teachings may also be useful in a cryogenic cooling system. For example, the conduit may be provided having a low temperature and the surrounding environment may be at a higher temperature relative to the conduit. In this manner, the cathode electrode may be in thermal contact with the conduit 24 and the anode electrode may be in thermal contact with an ambient air environment 38, such that the cathode electrode is exposed to the lower temperature.

Figure 4:
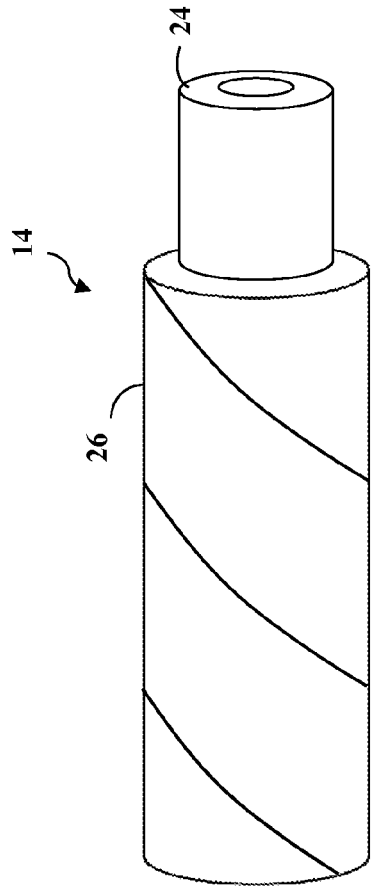
FIG. 4 illustrates the flexible thermo-electrochemical cell of FIG. 2 helically wrapped around a portion of a conduit.

In various aspects, the flexible thermo-electrochemical cell may be manufactured as a generally flat cell that can be shaped to conform about the perimeter of the conduit 26. For example, a flat cell may be folded around the conduit 24 of FIG. 3 in the direction of Arrow "A" where first and second opposing ends of the cell are arranged next to one another adjacent a seam area 36. Various adhesives may be used to secure the flexible thermo-electrochemical cell to the conduit 24. FIG. 4 illustrates an alternative aspect having the flexible thermo-electrochemical cell 26 helically wrapped around a portion of a conduit 24. It is envisioned that the flexible thermo-electrochemical cell 26 can be tightly aligned and wrapped around the conduit 24 as shown, or may be separated by a small distance, as may be desired.

In various aspects, the anode electrode 28 and/or the cathode electrode 30 may comprise one or more nanoporous materials, for example, having an organic or inorganic framework supporting a porous structure. In one example, the nanoporous material may be an activated carbon textile, such as an activated carbon fiber cloth. The cloth may be single or double weaved or knitted. Activated carbon textiles can be provided with a relatively high specific surface area and are generally pliable and flexible such that they are compatible with curved surfaces. In certain aspects and in order to enhance stability and activity, the activated carbon textile may also be incorporated with carbon nanotubes, such as carbon multiwalled nanotubes, using solution-based or dip-coating methods known in the art.

The electrolyte 32 material is preferably an aqueous electrolyte including a concentration of ions near a saturation point. In one non-limiting example, the electrolyte includes a ferri/ferrocyanide anion redox couple ($Fe(CN)_6^{3-}/Fe(CN)_6^{4-}$). Other redox couples, such as $Fe^{2+}/Fe$, $Np^{4+}/Np^{3+}$, and $Cu^{2+}/Cu$, may also be used.

The present teachings additionally provide various methods for generating electric power using low grade thermal energy from a vehicle. As detailed above, the methods may include conforming, shaping, and/or surrounding at least a portion of a coolant conduit system with a flexible thermo-electrochemical cell. Each cell preferably includes a nanoporous cathode electrode, a nanoporous anode electrode, and an electrolyte as previously discussed. One or more cells may be folded over a conduit, or helically wrapped around a cylindrical portion of the coolant conduit system. In certain other aspects, a radiator or other heat exchanger may also be in thermal communication with a flexible thermo-electrochemical cell, with the cell conforming to the shape of at least a portion of the radiator or heat exchanger.

The method includes controlling and circulating a coolant fluid through the various regions of the coolant conduit system, which is at some point in thermal communication with a power generating unit, such as an internal combustion engine or fuel cell stack. The method includes maintaining a temperature gradient in the electrolyte solution by contacting the anode electrode with the coolant conduit system, and exposing the cathode electrode to a temperature lower than a temperature of the coolant conduit system. It is envisioned that the generated electrical power can be collected for subsequent use. In other aspects, the generated electrical charges can be directed to a vehicle battery, a coolant pump, or other auxiliary device.

Figure 5:
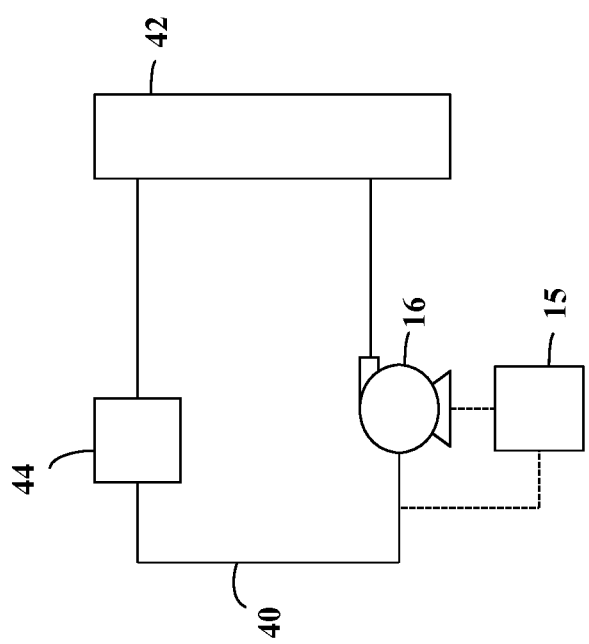
FIG. 5 is an exemplary, simplified diagram illustrating a conduit system circulating a fluid through a heat source according to another aspect of the present teachings.

In still other aspects, it is contemplated that the present technology can also be used in residential housing applications and/or with certain solar or geothermal energy recovery systems. Accordingly, the present teachings provide a method for converting thermal heat into electricity in order to self-power one or more auxiliary devices. FIG. 5 is an exemplary, simplified diagram illustrating a conduit system 40 circulating a fluid through a heat source 42. This embodiment includes contacting at least a portion of a conduit 40 with a flexible thermo-electrochemical cell including a cathode electrode, an anode electrode, and an electrolyte as described above. The fluid is maintained circulating through the conduit 40 with a pump 16 and a controller 15, and is in thermal communication with a heat source 42. Exemplary heat sources can vary widely and may include hot water pipes, solar panels, and a geothermal well. The method includes maintaining a temperature gradient in the electrolyte by keeping the anode electrode in contact with the conduit system, and exposing the cathode electrode to a temperature lower than a temperature of the conduit system. The generated electricity may be collected and directed to the auxiliary device 44. In one specific example, a temperature gradient between residential hot and cold water pipe systems can be utilized by appropriately coupling the pipe system with the flexible thermo-electrochemical cell, and generating electrical energy to power an automatic meter reading transmitter commonly used to determine water usage for billing purposes. As described above, other non-limiting examples of auxiliary devices may include a flow meter, a temperature sensor, and various components affiliated with wireless telemetry devices, or the like.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. An energy recovery system for generating electric power using thermal energy from a vehicle, the system comprising:
   a coolant conduit system;
   a power generating unit;
   a coolant pump configured to circulate a coolant fluid through the coolant conduit system and in thermal communication with the power generating unit; and
   a flexible thermo-electrochemical cell shaped and conformed to surround and helically wrap at least a portion of the coolant conduit system, the flexible thermo-electrochemical cell including a nanoporous cathode electrode, a nanoporous anode electrode, and an aqueous electrolyte,
   wherein the anode electrode is in thermal contact with the coolant conduit system, and the cathode electrode is in thermal contact with an ambient air environment, and exposed to a temperature lower than a temperature of the coolant conduit system.

2. The energy recovery system according to claim 1, wherein at least one of the cathode electrode and anode electrode comprises carbon nanotubes.

3. The energy recovery system according to claim 2, wherein at least one of the cathode electrode and anode electrode comprises an activated carbon textile coated with carbon multiwalled nanotubes.

4. The energy recovery system according to claim 1, wherein the aqueous electrolyte comprises ferri/ferrocyanide anions.

5. The energy recovery system according to claim 1, further comprising a capacitor for storing electrical power generated from the flexible thermo-electrochemical cell.

6. The energy recovery system according to claim 5, further comprising a plurality of spaced apart current collecting electrodes electrically coupled to the capacitor.

7. The energy recovery system according to claim 1, wherein generated electrical power is directed to at least one of a vehicle battery and the coolant pump.

8. The energy recovery system according to claim 1, wherein the power generating unit comprises at least one of an internal combustion engine and a fuel cell stack.

9. The energy recovery system according to claim 1, wherein an average temperature gradient between the anode electrode and the cathode electrode is maintained from about 20° C. to about 60° C.

10. The energy recovery system according to claim 1, comprising a plurality of flexible thermo-electrochemical cells.

11. The energy recovery system according to claim 1, further comprising a controller configured to monitor and direct a flow of coolant through the coolant conduit system.

12. A method for generating electric power using thermal energy from a vehicle, the method comprising:
   surrounding, by helically wrapping, at least a portion of a coolant conduit system with a flexible thermo-electrochemical cell including a nanoporous cathode electrode, a nanoporous anode electrode, and an aqueous electrolyte;
   circulating a coolant fluid through the coolant conduit system and in thermal communication with a power generating unit;
   maintaining a temperature gradient in the electrolyte by contacting the anode electrode with the coolant conduit system, and exposing the cathode electrode to an ambient air environment at a temperature lower than a temperature of the coolant conduit system; and
   collecting generated electrical charges.

13. The method according to claim 12, wherein at least one of the anode electrode and the cathode electrode comprises an activated carbon textile coated with carbon multiwalled nanotubes, and the electrolyte is an aqueous electrolyte comprising ferri/ferrocyanide anions.

14. The method according to claim 12, wherein collecting the generated electrical charges comprises directing the charges to a vehicle battery.

* * * * *